United States Patent [19]

Yamagata

[11] Patent Number: 5,650,724

[45] Date of Patent: Jul. 22, 1997

[54] MAGNETIC-RESONANCE IMAGING APPARATUS

[75] Inventor: Hitoshi Yamagata, Ootawara, Japan

[73] Assignee: Kabushiki Kaisha Toshiba, Kawasaki, Japan

[21] Appl. No.: 302,167

[22] Filed: Sep. 8, 1994

[30] Foreign Application Priority Data

Sep. 13, 1993 [JP] Japan ................................. 5-227062

[51] Int. Cl.⁶ .............................. G01V 03/00; G01V 03/14
[52] U.S. Cl. .......................... 324/320; 324/318; 324/322
[58] Field of Search ................................. 324/318, 320, 324/322, 307, 309

[56] References Cited

U.S. PATENT DOCUMENTS 5,173,661 12/1992 Knüttel et al. ........................ 324/309
5,235,279 8/1993 Kaufman et al. .................... 324/318 X

*Primary Examiner*—Sandra L. O'Shea
*Assistant Examiner*—Mack Haynes
*Attorney, Agent, or Firm*—Ronald L. Yin; Limbach & Limbach LLP

[57] ABSTRACT

A magnetic-resonance imaging apparatus of the present invention comprises a gantry having a subject-placeable inner space and a local coil assembly insertable into an inner space of the gantry. The gantry has a static magnetic field magnet for creating a static magnetic field, a gradient magnetic field coil unit for creating, in the static magnetic field, a gradient magnetic field whose magnetic field intensity is varied in accordance with a position so that spatial position information may be imparted to a magnetic-resonance signal, a transmit/receive coil for exciting the subject with a high-frequency magnetic field and receiving a magnetic-resonance signal induced from the subject, and a first shim coil unit for correcting those inhomogeneous magnetic field components of the static magnetic field. The local coil assembly is equipped with a second shim coil unit for correcting those inhomogeneous magnetic field components of the static magnetic field.

17 Claims, 4 Drawing Sheets

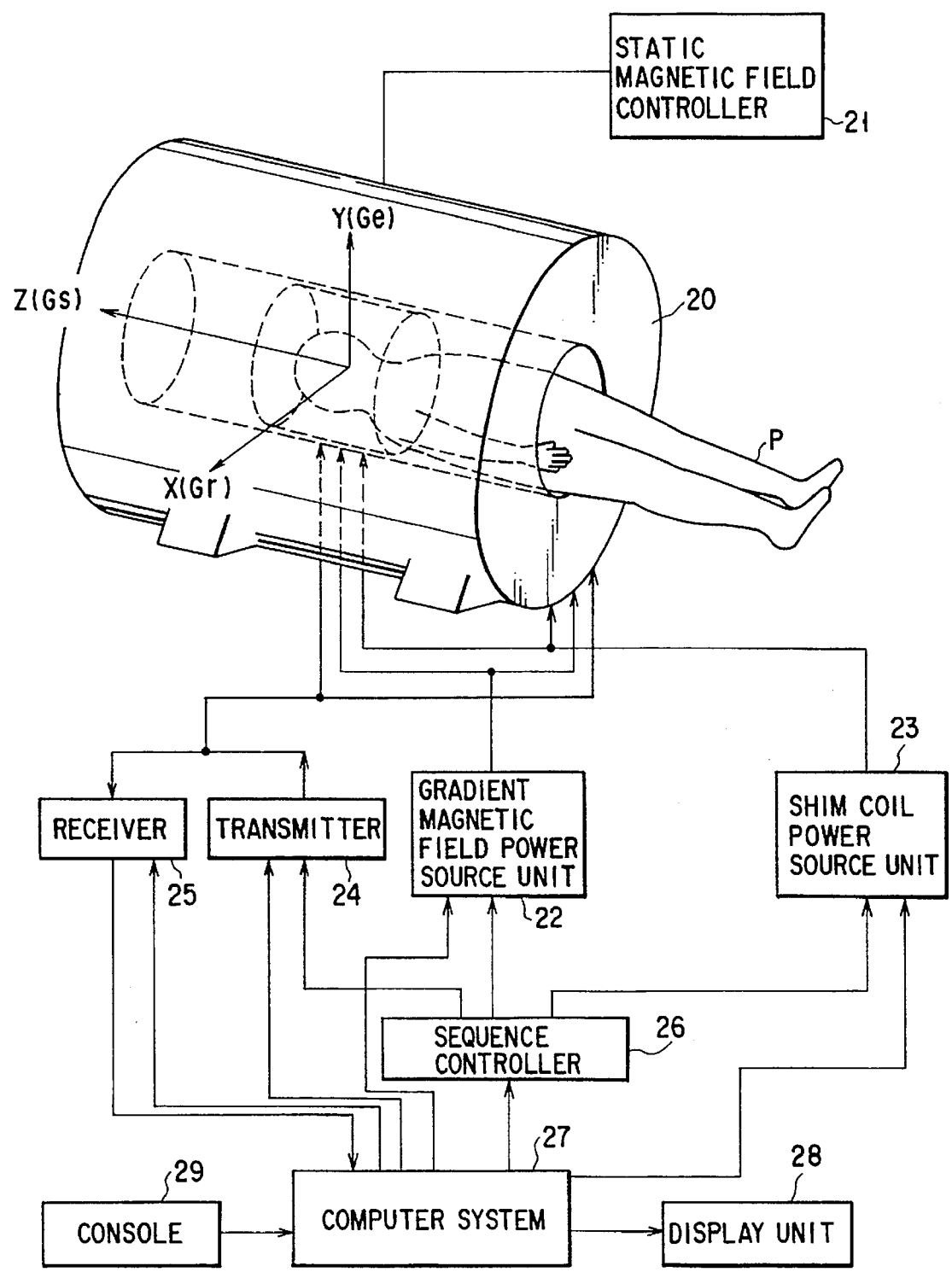
F I G. 1

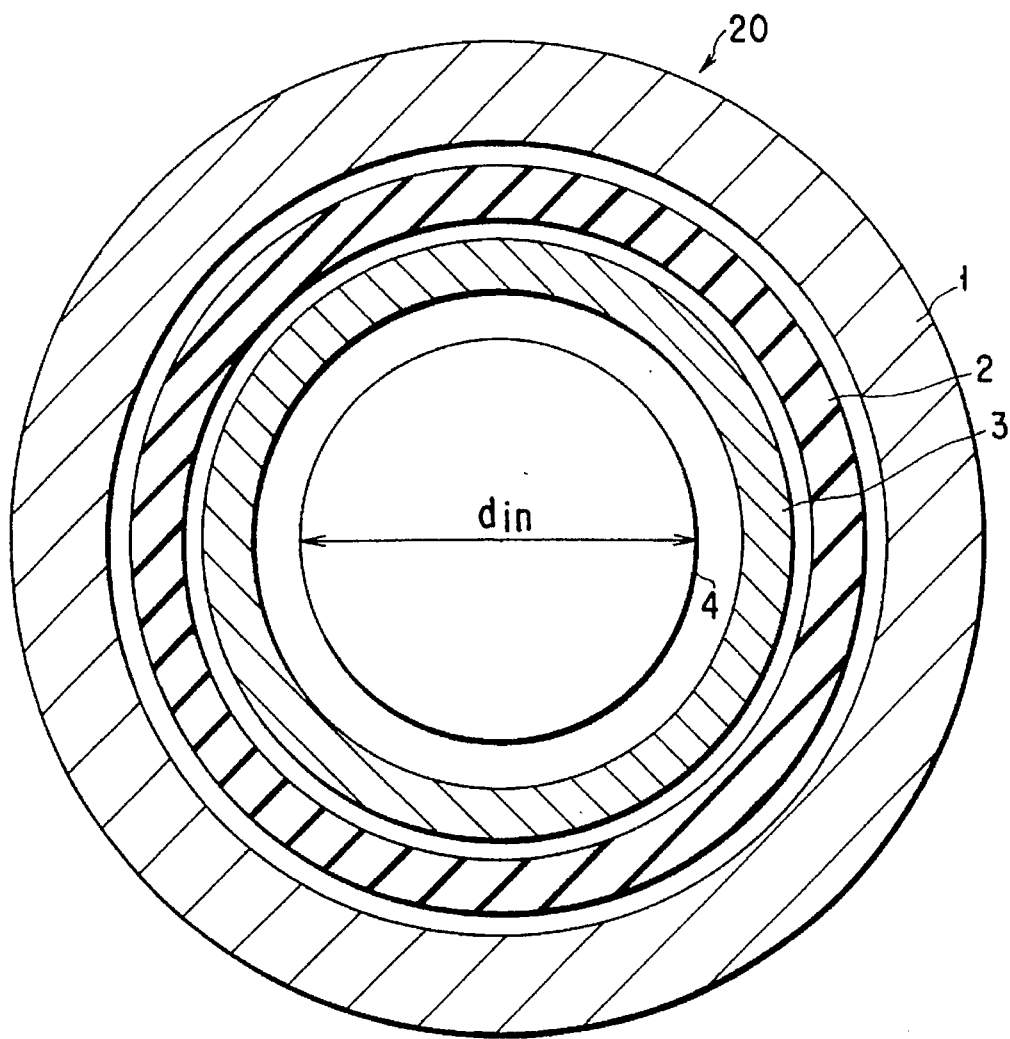
F I G. 3A
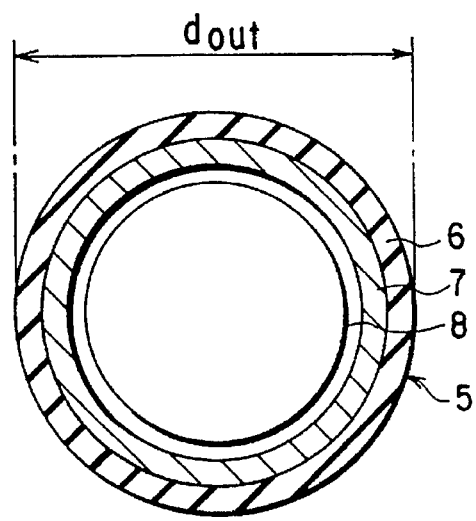
F I G. 3B

MAGNETIC-RESONANCE IMAGING APPARATUS

BACKGROUND OF THE INVENTION

1. Field of the Invention

The present invention relates to a magnetic-resonance imaging apparatus for enhancing the homogeneity of a static magnetic field with a shim coil unit.

2. Description of the Related Art

For the magnetic-resonance imaging, the homogeneity of a static magnetic field constitutes an important element in performance evaluation. A method for correcting error-containing magnetic field components so as to enhance the homogeneity of a static magnetic field is known in the art. Two methods are known: a first method and a second method. The first method is called a stationary passive shimming method according to which a static field magnetic unit, gradient magnetic field coil unit and transmit/receive coil are assembled and a plurality of iron segments are properly arranged at a cylindrical gantry into which a subject to be examined is placed. The second method is called an active shimming method according to which dynamic correction can be achieved by properly supplying an electric current through a plurality of shim coils arranged at a gantry. The first method has been extensively employed from the standpoint of achieving a light-weight apparatus. An inhomogeneous magnetic field component of the static magnetic field contains 1st-order components X, Y, Z, 2nd-order components $Z^2$, XY, $X^2$, $Y^2$, ..., 3rd-order components $Z^3$, $Z^2X$, $Z^2Y$, ... and a shim coil is provided for every magnetic field components. In practice, use is made of a shim coil set corresponding to 13 channels and 18 channels.

A very high-accuracy homogeneity is required in an imaging method, such as an MRS (MR spectroscopy), MRSI (MR spectroscopic imaging) and EPI (echo-planar imaging). The high-accuracy homogeneity can be achieved by carrying a large current through the shim coil. It has been difficult, however, to obtain a high-level homogeneity because a power source loading problem presents a barrier.

SUMMARY OF THE INVENTION

It is accordingly the object of the present invention to provide a magnetic-resonance imaging apparatus which can achieve a high-level homogeneity by alleviating a power source load on a shim coil unit.

According to one aspect of the present invention, there is provided a magnetic-resonance imaging apparatus comprising:

a gantry having a static magnetic field magnet for creating a static magnetic field, a gradient magnetic field coil for creating, in the static magnetic field, a gradient magnetic field whose magnetic field intensity is varied in accordance with a position so that spatial position information may be imparted to a magnetic field resonance signal, a transmit/receive coil for exciting a subject, to be examined, by a high-frequency magnetic field and receiving the magnetic-resonance signal induced from the subject, and a first shim coil unit for correcting those inhomogeneous magnetic field components of the static magnetic field, and having an inner space with the subject placeable therein; and a local coil assembly equipped with a second shim coil unit for correcting the inhomogeneous magnetic field components of the static magnetic field and insertable into an inner space of the gantry.

According to another aspect of the present invention, there is provided a magnetic-resonance imaging apparatus comprising:

a gantry having a static magnetic field magnet for creating a static magnetic field, a gradient magnetic field coil unit for creating, in the static magnetic field, a gradient magnetic field whose magnetic field intensity is varied in accordance with a position so that spatial position information may be imparted to a magnetic field resonance signal, and a transmit/receive coil for exciting a subject, to be examined, by a high-frequency magnetic field and receiving the magnetic field resonance signal induced from the subject, and having an inner space with the subject placeable therein; and a local coil assembly equipped with a shim coil unit for correcting those inhomogeneous components of the static magnetic field and insertable into the inner space of the gantry.

According to another aspect of the present invention there is provided a local coil assembly insertable in an imaging space of a gantry of a magnetic-resonance imaging apparatus, comprising:

a receiving coil for receiving a magnetic-resonance signal induced from a subject, to be examined, which is excited with a high-frequency magnetic field; and a shim coil unit for correcting those inhomogeneous magnetic field components of a static magnetic field.

Additional objects and advantages of the invention will be set forth in the description which follows, and in part will be obvious from the description, or may be learned by the practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a schematic view showing an arrangement showing a magnetic-resonance imaging apparatus according to an embodiment of the present invention;

FIG. 3A is a cross-sectional view showing the gantry of FIG. 1;

FIG. 3B is a cross-sectional view showing the local coil assembly of FIG. 1;

DETAILED DESCRIPTION OF THE PREFERRED EMBODIMENT

An embodiment of the present invention will now be explained below with reference to the accompanying drawings.

Figure 2:
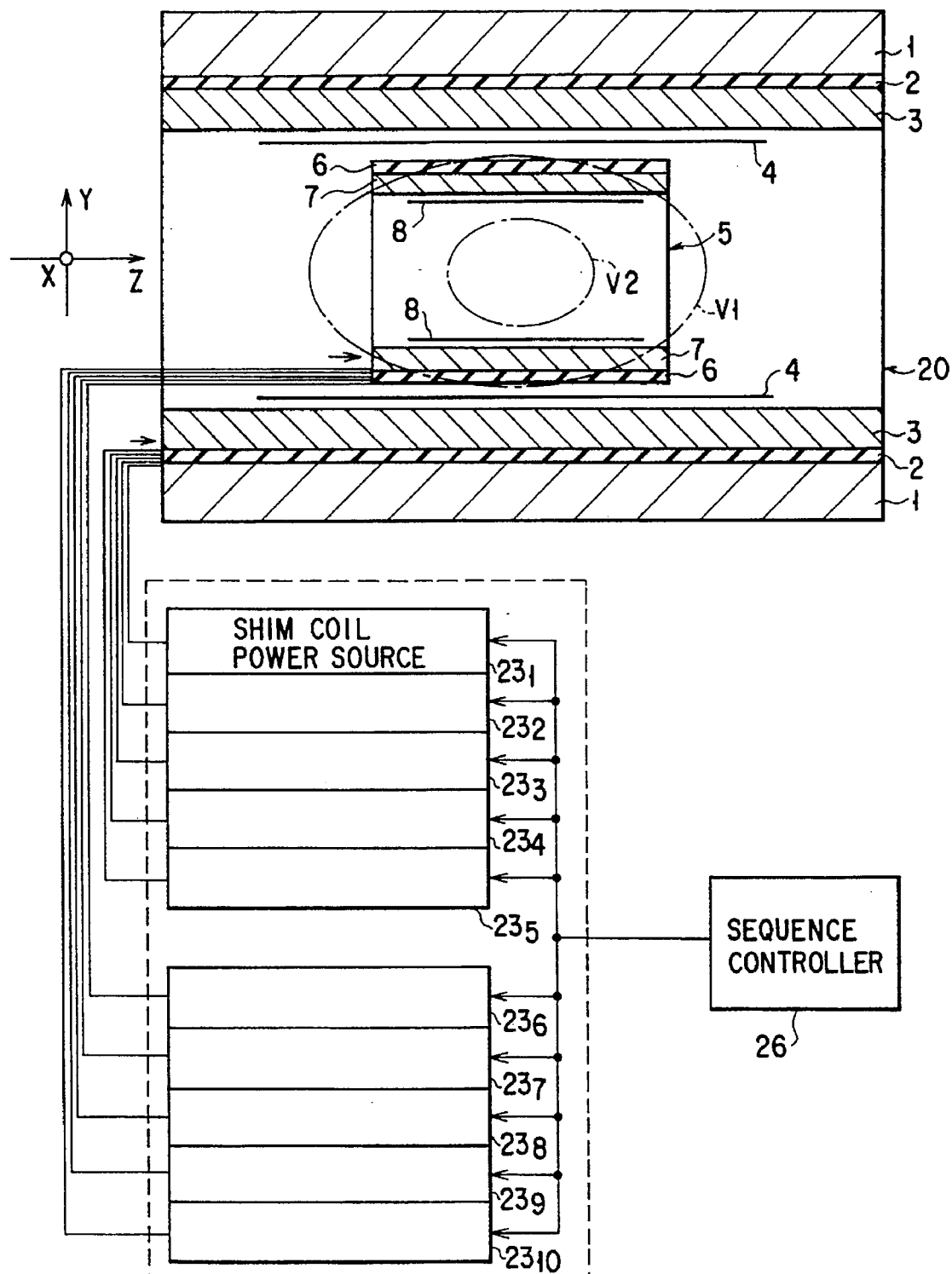
FIG. 2 is a longitudinal cross-sectional view showing a gantry of FIG. 1 and local coil assembly.
Figure 4A:
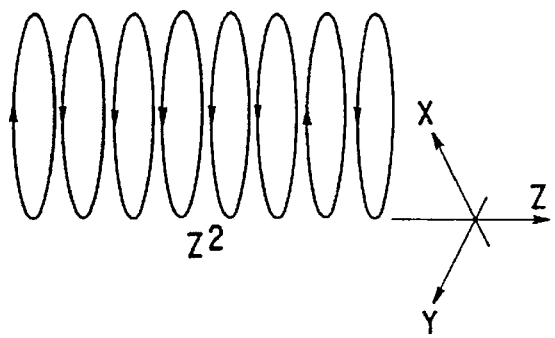
FIG. 4A is a perspective view showing one shim coil unit.
Figure 4B:
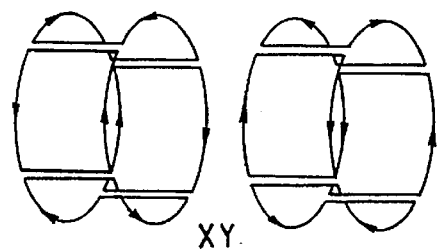
FIG. 4B another shim coil unit.
Figure 4C:
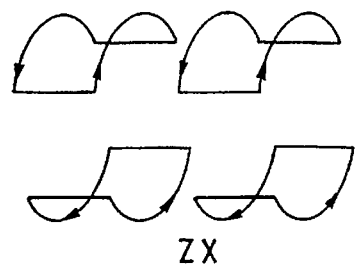
FIG. 4C another shim coil unit.
Figure 4D:
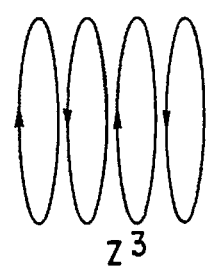
FIG. 4D another shim coil unit.
Figure 4E:
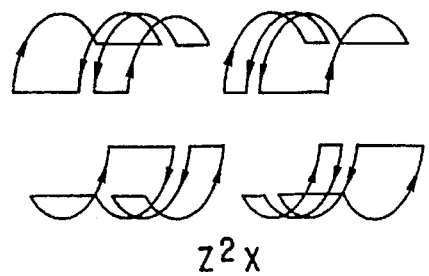
FIG. 4E another shim coil unit.
Figure 4F:
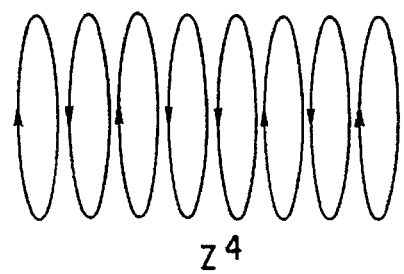
FIG. 4F another shim coin unit.

FIG. 1 shows an arrangement of a magnetic-resonance imaging apparatus according to an embodiment of the present invention. FIG. 2 is a longitudinal cross-sectional view showing an arrangement of a gantry and local coil assembly. The gantry 20 is cylindrically formed to allow a full length of a subject P to be examined to be placed in the cylindrical gantry. The gantry is comprised of a laminated structure of a static magnetic field magnet 1, "full-length" first shim coil unit 2, "full-length" gradient magnetic field coil unit 3 and "full-length" transmit/receive coil 4, all these being formed in that order when viewed in a direction from the outside toward the inside. The static magnetic field magnetic 1 receives electric current, creating a static magnet field along a Z direction in an inner space of the gantry 20. The static magnetic field magnet 1 may be made of any of a superconductive coil and normal conductive coil. The first shim coil unit 2 is used to correct those inhomogeneous magnetic field components of a static magnetic field, the details of which will be set out below. In order to provide X, Y and Z spatial position information to corresponding magnetic-resonance signals, the gradient magnetic field coil unit 3 creates, in an imaging area V1, a gradient magnetic field whose magnetic field intensity is varied along the respective X, Y and Z axes. A corresponding image is obtained in the imaging area V1. The transmit/receive coils 4 excites the subject P in a high-frequency magnetic field in a radio band and detects a magnetic-resonance signal excited from the subject P.

A local coil assembly 5 is inserted in the imaging area V1 in the inner space of the cylindrical gantry 20 when a local image is taken and not inserted when a normal "full-length" image is taken from the subject. The local coil assembly 5 is so dimensioned that its outer diameter $d_{out}$ is made smaller than an inner diameter $_{in}$ of the gantry 20 as shown in FIGS. 3A and 3B to allow the local coil assembly 5 to be inserted into the inner space of the gantry 20. The local coil assembly 5 is comprised of a laminated structure of a local second shim coil unit 6 for locally correcting those inhomogeneous components of a static magnetic field, local gradient magnetic field coil unit 7 for locally creating a gradient magnetic field in the X, Y, Z axes in the imaging area V2 and local transmit/receive coils 8 for locally exciting the subject P and detecting a magnetic-resonance signal induced from a local area of the subject P, all these being formed in that order when viewed in a direction from the outside toward the inside.

A gradient magnetic field power source unit 22 supplies electric current to the gradient magnetic field coil unit 3 when a full-length image is taken and to the gradient magnetic field coil unit 7 when a local image is taken from the subject. A shim coil power source unit 23 supplies electric current to the first shim coil unit 2 and second shim coil unit 6. A transmitter 24 supplies electric current to the transmit/receive coil 4 in a full-length imaging mode and to the transmit/receive coil 8 in a local imaging mode. A receiver 25 receives a magnetic-resonance signal in the full-length imaging mode via the transmit/receive coil 4 and a magnetic-resonance signal in the local imaging mode via the transmit/receive coil 8. The magnetic-resonance signal received by the receiver 25 is input to a computer system 27 where a magnetic-resonance image is composed from the magnetic-resonance signal. The magnetic-resonance image is sent to a display unit 28 where it is displayed. A console 29 is connected to the computer system 27 so as to select a "full-length" imaging mode and local imaging mode. A sequence controller 26 controls the gradient magnetic field power source unit 22, transmitter 24, receiver 25 and shim coil power source unit 23 in accordance with a predetermined sequence of a spin-echo method, etc.

The static magnetic field contains, as inhomogeneous magnetic field components,

1st-order components; X, Y, Z

2nd-order components; $Z^2$, ZX, $X^2$, ZY, $Y^2$, XY

3rd-order components; $Z^3$, $Z^2X$, $ZX^2$, $X^3$, $Z^2Y$, $ZY^2$, $Y^3$, $X^2Y$, $XY^2$, XYZ 4th-order components; $Z^4$, $Z^3X$, $Z^2X^2$, $ZX^3$, $X^4$, $Z^3Y$, $Z^2Y^2$, $ZY^3$, $Y^4$, $X^3Y$, $X^2Y^2$, $XY^3$, $XYZ^2$, $XY^2Z$, $X^2YZ$ One magnetic field component is corrected by a corresponding shim coil and the shim coil is so formed as to have a configuration corresponding to the magnetic field component corrected thereby. FIGS. 4A to 4F show the configurations of the shim coil units corresponding to typical magnetic field components. The shim coil configurations of the respective magnetic field components are the same as those in the prior art and, here, explanation of them is omitted for brevity's sake.

The first shim coil unit 2 is comprised of a plurality of shim coils for correcting those different magnetic field components and the second shim coil unit 6 is comprised of a plurality of second shim coils for correcting those different magnetic field components. As shown in FIG. 2, the shim coil power source unit 23 has those shim coil power sources $23_1$ to $23_{10}$ corresponding to a total number of shim coils of the shim coil units 2, 6 and the shim coil units 2, 6 are of such a type that their respective shim coils can be driven in an independent way.

In contrast with the kind of shim coils in the first shim coil unit 2, the shim coils in the second shim coil unit 6 contain three kinds of patterns, the first to third patterns, as will be set out below. According to the present invention, any of these patterns may be adopted.

FIRST PATTERN

For the first pattern, the second shim coil unit 6 has those shim coils different in kind from the shim coils in the first shim coil unit 2. That is, the first shim coil unit 2 corrects all or some of lower-dimensional a-th to b-th-order (a, b: any integer of 1 or more, a≦b) magnetic field components and the second shim coil unit 6 corrects all or some of higher-dimensional b+1st to c-th-order (c: any integer of 1 or more, b+1≦c) magnetic field components. Here, the first shim coil unit 2 corrects 2nd-order (a=b=2 in this case) magnetic field components and has the first shim coils correspondingly. Further, the second shim coil unit 6 corrects all or some of 3rd to 6th-order (c=6 in this case) magnetic field components and has a plurality of second shim coils correspondingly. The first shim coil unit 2 is not equipped with any 1st-order component correcting shim coil and the reason is that, generally, the gradient magnetic field coil of the gradient magnetic field coil unit 3 may serve also as a 1st-order component correcting shim coil. This does not mean, however, that the first shim coil unit 2 should not be equipped with any 1st-order component correcting shim coil.

SECOND PATTERN

For the second pattern, some of a plurality of second shim coils in the second shim coil unit 6 is the same as the first shim coils of the first shim coil unit 2. That is, the first shim coil unit 2 corrects all or some of lower-dimensional a-th to b-th (a, b: any integer of 1 or more, a≦b) magnetic field components and the second shim coil unit 6 corrects all or some of lower- to higher-dimensional c-th to d-th (c, d: any integer of 1 or more, a≦c≦b, d>b) magnetic field components. Here, the first shim coil unit 2 corrects 2nd-order (a=b=2 in this case) magnetic field components and has three first shim coils correspondingly. At this time, the second shim coil unit 6 corrects all or some of 2nd-order (c=2 in this case) and 3rd- or higher-order magnetic field components (d≧3 in this case) of higher dimension and has a plurality of second shim coils correspondingly. The first shim coil unit 2 and second shim coil unit 6 are not equipped with any 1st-order component correcting shim coils and the reason is that, generally, the gradient magnetic field coils in the gradient magnetic field coil units 3, 7 serve also as 1st-order component correcting shim coils. However, this does not mean that the first shim coil unit 2 and second shim coil 6 should not be equipped with any 1st-order component correcting shim coils.

THIRD PATTERN

For the third pattern, the first shim coil unit 2 and second shim coil unit 6 have the same kind of shim coils. That is, the first shim coil unit 2 corrects all or some of a-th to b-th (a, b: any integer of 1 or more, a≦b) magnetic field components and the second shim coil unit 6 corrects all or some of the same a-th to b-th magnetic field components as the first shim coil unit 2. Here, the first shim coil unit 2 corrects 2nd to 6th-order (a=2, b=6) magnetic field components and has a plurality of first shim coils correspondingly. At that time, the second shim coil unit 6 corrects all or some of the same 2nd to 6th-order magnetic field components as the first shim coil unit 2 and has a plurality of second shim coils correspondingly. The first shim coil unit 2 and second shim coil unit 6 are not equipped with any 1st-order component correcting shim coils and the reason is that, generally, the gradient magnetic field coils of the gradient magnetic field coil units 3, 7 may serve also as the 1st-order component correcting shim coil. This does not mean, however, that the first shim coil unit 2 and second shim coil unit 6 should not be equipped with the 1st-order component shim coils.

The operation of the present embodiment will be explained below.

FULL-LENGTH IMAGING

The full-length imaging is performed with the local coil assembly 5 not inserted in the inner space of the gantry 20. At that time, the full-length imaging mode is selected through the console 29. The sequence controller 26 controls the gradient magnetic field power source unit 22, transmitter 24, receiver 25 and shim coil power source unit 23 in accordance with a predetermined sequence. The gradient magnet field power source unit 22 supplies electric current to the gradient magnetic field coil unit 3 under the control of the computer system 27. The shim coil power source unit 23 supplies electric current to the first shim coil unit 2 under the control of the computer system 27. Through the first shim coils in the first shim coil unit 2, two-dimensional magnetic field components correct-able by the first shim coil unit 2 are corrected for the first and second patterns and all or some of the two- to six-dimensional magnetic field components are corrected for the third pattern. By so doing it is possible to enhance the homogeneity of the static magnetic field. The transmitter 24 supplies electric current to the transmit/receive coil 4 under the control of the computer system 27. The subject is excited under the high-frequency magnetic field created from the transmit/receive coil 4. A predetermined time after the excitation has been made, the receiver 25 receives a magnetic-resonance signal, under the control of the computer system 27, which comes via the transmit/receive coil 4. The magnetic-resonance signal thus received is input to the computer system 27 where a magnetic-resonance image is composed to enable it to be displayed on the display unit 28.

LOCAL IMAGING

The local imaging is made with the coil assembly 5 inserted in the inner space of the gantry 27 in which case a local area, such as the head and lower extremities of the subject, is located near the assembly 5. At that time, the local imaging mode is selected via the console 29. The local imaging operation differs for each of the first to third patterns as set out above. Explanation will be given below about the respective patterns.

FIRST PATTERN

The sequence controller 26 controls the gradient magnetic field power source unit 22, transmitter 24, receiver 25 and shim coil power source unit 23 in accordance with a predetermined sequence. The gradient magnetic field power source unit 22 supplies electric current to the gradient magnetic field coil unit 7.

The shim coil power source unit 23 supplies electric current to the first shim coil unit 2 and second shim coil unit 6 under the control of the computer system 27. Those two-dimensional magnetic field components are corrected by the first shim coils in the first shim coil unit 2 and those three- to six-dimensional magnetic field components are corrected by the second shim coils in the second shim coil unit 6. By so doing it is possible to obtain the homogeneity of a static magnetic field with high accuracy.

The transmitter 24 supplies electric current to the transmit/receive coil 8 under the control of the computer system 27. The subject is locally excited by a high-frequency magnetic field from the transmit/receive coil 8. A predetermined time after the excitation has been completed, the receiver 25 receives a magnetic-resonance signal, under the control of the computer system 27, which comes via the transmit/receive coil 8. The magnetic-resonance signal thus received is input to the computer system 27 where a magnetic-resonance image is composed to enable it to be displayed on the display unit 28.

In this way, in the first pattern, the two-dimensional magnetic field components are corrected by the first shim coil unit 2 and all or some of three- and six-dimensional magnetic field components are corrected by the second shim coil units 6.

In the local imaging mode, use is made of an imaging method, such as an MRS (MR spectroscopy), MRI (MR spectroscopic imaging) and EPI (echo-planar imaging), but these imaging methods require a very high accuracy of homogeneity. In view of the situation in which the three- or higher-dimensional magnetic field components are corrected by the first shim coil unit 2, it has been necessary to supply high electric current to the first shim coil because the first shim coil is made up of a coil element of larger diameter and because the coil diameter is larger for the first shim coil 2. This has exerted a greater load on the shim coil power source unit 23. According to the present invention, however, the three- or more dimensional magnetic field components are corrected by the second shim coil 6 smaller in its coil element's diameter and its coil diameter than the first shim coil 2 and, in this case, it is only necessary to pass low current through the second shim coil 6, that is, a current one-third to one-fourth the current through the first shim coil. This alleviates a load on the shim coil power source unit 23.

SECOND PATTERN

The sequence controller 26 controls the gradient magnetic field power source unit 22, transmitter 24, receiver 25 and shim coil power source unit 23 in accordance with a predetermined sequence. The gradient magnetic field unit 22 supplies electric current to the gradient magnetic field coil unit 7.

The shim coil power source unit 23 supplies electric current to the second shim coil unit 6 under the control of the computer system 27. Two- and six-dimensional magnetic field components are corrected by the second shim coils in the second shim coil unit 6. By so doing, it is possible to obtain the homogeneity of a static magnetic field with high accuracy.

For the second pattern, the first shim coil unit 2 also has those shim coils for correcting two-dimensional magnetic field components, but the first shim coil unit 2 is not used. The reason is that the two-dimensional magnetic field components are corrected by the second shim coil unit 6. Let it be assumed that the same two-dimensional magnetic field components are corrected by both the first shim coil unit 2 and the second shim coil unit 6. In this case, at the rise and fall of electric currents in particular, a mutual interference occurs between those corrected magnetic fields, an unfavorable situation which is avoided according to the present invention.

The transmitter 24 supplies electric current to the transmit/receive coil 8 under the control of the computer system 27. The substrate is locally excited by a high-frequency magnetic field created from the transmit/receive coil 8. A predetermined time after the excitation has been completed, the receiver 25 receives a magnetic-resonance signal, under the control of the computer system 27, which comes via the transmit/receive coil 8. The magnetic-resonance signal thus received is input to the computer system 27 where a magnetic-resonance image is composed. The image is displayed on the display unit 28.

For the second pattern, all or some of the two- to six-dimensional magnetic field components are corrected by the second shim coil unit 6. This alleviates a load on the shim coil power source unit 23 as in the case of the first pattern.

THIRD PATTERN

The sequence controller 26 controls the gradient magnetic field power source unit 22, transmitter 24, receiver 25 and shim coil power source unit 23 in accordance with a predetermined sequence. The gradient magnetic field power source unit 22 supplies electric current to the gradient magnetic field coil unit 7.

The shim coil power source unit 23 supplies electric current to the second shim coil unit 6 under the control of the computer system 27. Two to six-dimensional magnetic field components are corrected by the second shim coil unit 6 whereby the homogeneity of a static magnetic field can be obtained with high accuracy.

In the third pattern, the first shim coil unit 2 has those shim coils for correcting the two- to six-dimensional magnetic field components, but, as in the case of the second pattern, the first shim coil unit 2 is not used. The reason is that the second shim coil unit 6 corrects the two- to six-dimensional magnetic field components. Let it be assumed that the same magnetic field components are corrected by the first shim coil unit 2 and second shim coil unit 6. In this case, at the rise and fall of electric currents in particular, a mutual interference occurs between the corrected magnetic fields. According to the present invention, however, it is possible to avoid such an unfavorable situation caused by the mutual interference.

The transmitter 24 supplies electric current to the transmit/receive coil 8 under the control of the computer system 27. The subject is locally excited by a high-frequency magnetic field created from the transmit/receive coil 8. A predetermined time after the excitation has been completed, the receiver 25 receives a magnetic-resonance signal, under the control of the computer system, which comes via the transmit/receive coil 8. The magnetic-resonance signal thus received is input to the computer system 27 where a magnetic-resonance image is composed. The image composed is displayed on the display unit 28.

In the first pattern, all or some of the two- to six-dimensional magnetic field components are corrected by the second shim coil unit 6. This alleviates a load on the shim coil power source unit 23 as in the case of the first pattern.

The present invention is not restricted to the above-mentioned embodiment only and various changes or modifications of the present invention can be made without departing from the spirit and scope of the present invention.

Additional advantages and modifications will readily occur to those skilled in the art. Therefore, the invention in its broader aspects is not limited to the specific details, and representative devices and shown and described herein. Accordingly, various modifications may be made without departing from the spirit or scope of the general inventive concept as defined by the appended claims and their equivalents.

What is claimed is:

1. A magnetic-resonance imaging apparatus comprising:
   a gantry having a static magnetic field magnet for creating a static magnetic field, a gradient magnetic field coil for creating, in the static magnetic field, a gradient magnetic field whose magnetic field intensity is varied in accordance with a position so that spatial position information may be imparted to a magnetic field resonance signal, a transmit/receive coil for exciting a subject, to be examined, by a high-frequency magnetic field and receiving the magnetic-resonance signal induced from the subject, a first shim coil unit for correcting a first inhomogeneous static magnetic field components which is an nth or lower order inhomogeneous static magnetic field components, and an inner space with the subject placeable therein; and
   a local coil assembly equipped with a second shim coil unit for correcting a second inhomogeneous static magnetic field components, which is an (n+1)th or higher order inhomogeneous static magnetic field components, and is insertable into an inner space of the gantry.

2. The magnetic-resonance imaging apparatus according to claim 1, in which the first shim coil corrects 2nd-order static magnetic field components and the second shim coil corrects 3rd- or higher-order static magnetic field components.

3. The magnetic-resonance imaging apparatus according to claim 1, further comprising:
   a first power source unit for driving the first shim coil;
   a second power source unit for driving the second shim coil; and
   control means for controlling the first power source unit and second power source unit such that, when the local coil assembly is not inserted into the inner space of the gantry, the first inhomogeneous static magnetic field component is corrected by the first shim coil and, when the local coil assembly is inserted into the inner space of the gantry, the first inhomogeneous static magnetic field component is corrected by the first shim coil and the second inhomogeneous static magnetic field component is corrected by the second shim coil.

4. The magnetic-resonance imaging apparatus according to claim 1, wherein the second shim coil further corrects the first inhomogeneous static magnetic field component.

5. The magnetic-resonance imaging apparatus according to claim 4, in which the first shim coil corrects a 2nd-order inhomogeneous static magnetic field components and the second shim coil corrects 2nd- to 3rd- or higher-order inhomogeneous static magnetic field components.

6. The magnetic-resonance imaging apparatus according to claim 4, further comprising:

a first power source unit for driving the first shim coil;

a second power source unit for driving the second shim coil; and control means for controlling the first power source unit and second power source unit such that, when the local coil assembly is not inserted into the inner space of the gantry, the first inhomogeneous static magnetic field component is corrected by the first shim coil and, when the local coil assembly is inserted into the inner space of the gantry, the second inhomogeneous static magnetic field component is corrected by the first shim coil.

7. The magnetic-resonance imaging apparatus according to claim 1, in which the first shim coil corrects a 2nd-or higher-order inhomogeneous static magnetic components and the second shim coil corrects 2nd- or higher-order inhomogeneous static magnetic components.

8. The magnetic-resonance imaging apparatus of claim 7, further comprising:

a first power source unit for driving the first shim coil;

a second power unit for driving the second shim coil; and control means for controlling the first power source unit and second power source unit such that, when the local coil assembly is not inserted into the inner space of the gantry, said first inhomogeneous static magnetic field component is corrected by the first shim coil and, when the local coil assembly is inserted into the inner space of the gantry, said second inhomogeneous static magnetic field component is corrected by the second shim coil.

9. The magnetic-resonance imaging apparatus according to claim 1, in which the local coil assembly is equipped with a transmit/receive coil.

10. The magnetic-resonance imaging apparatus according to claim 1, in which the local coil assembly is equipped with a gradient magnetic field coil.

11. A magnetic-resonance imaging apparatus comprising:

a gantry having a static magnetic field magnet for creating a static magnetic field, a gradient magnetic field coil unit for creating, in the static magnetic field, a gradient magnetic field whose magnetic field intensity is varied in accordance with a position so that spacial position information may be imparted to a magnetic field resonance signal, and a transmit/receive coil for exciting a subject, to be examined, by a high-frequency magnetic field and receiving the magnetic field resonance signal induced from the subject, and having an inner space with the subject placeable therein; and a local coil assembly equipped with a shim coil unit for correcting 2nd or higher order inhomogeneous static magnetic field components and is insertable into the inner space of the gantry.

12. The magnetic-resonance imaging apparatus according to claim 11, in which the local coil assembly has a receiving coil for receiving the magnetic-resonance signal induced from the subject.

13. The magnetic-resonance imaging apparatus according to claim 12, in which the receiving coil serves also as a transmitting coil for exciting the subject with the high-frequency magnetic field.

14. The magnetic-resonance imaging apparatus according to claim 11, in which the local coil assembly is equipped with a gradient magnetic field coil.

15. A local coil assembly insertable in an imaging space of a gantry of a magnetic-resonance imaging apparatus, comprising:

a receiving coil for receiving a magnetic-resonance signal induced from a subject, to be examined, which is excited with a high-frequency magnetic field; and a shim coil unit for correcting 2nd or higher order inhomogeneous static magnetic field components.

16. The local coil assembly according to claim 15, in which the receiving coil serves also as a transmitting coil for exciting the subject with a high-frequency magnetic field.

17. The local coil assembly according to claim 15, further comprising:

a gradient magnetic field coil unit for forming a gradient magnetic field whose magnetic field intensity is varied in accordance with a position so that spacial position information may be imparted to the magnetic field resonance signal.

* * * * *